United States Patent
Ishikawa et al.

(10) Patent No.: US 6,928,198 B2
(45) Date of Patent: Aug. 9, 2005

(54) EXPOSURE HEAD

(75) Inventors: Hiromi Ishikawa, Kanagawa (JP); Yoji Okazaki, Kanagawa (JP); Kazuhiko Nagano, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 224 days.

(21) Appl. No.: 10/443,995

(22) Filed: May 23, 2003

(65) Prior Publication Data

US 2003/0219189 A1 Nov. 27, 2003

(30) Foreign Application Priority Data

May 23, 2002 (JP) .......................... 2002-149879

(51) Int. Cl.⁷ .................. G02B 26/08; G02F 1/295
(52) U.S. Cl. .................. 385/4; 385/40; 359/197; 359/204
(58) Field of Search ............... 385/4, 40; 359/197, 359/204

(56) References Cited

U.S. PATENT DOCUMENTS

| | | | | |
|---|---|---|---|---|
| 6,034,378 A | * | 3/2000 | Shiraishi | 250/559.29 |
| 6,535,271 B1 | * | 3/2003 | Ogasawara | 355/37 |
| 6,542,178 B2 | * | 4/2003 | Miyagawa et al. | 347/256 |
| 6,717,106 B2 | * | 4/2004 | Nagano et al. | 219/121.83 |
| 6,768,505 B2 | * | 7/2004 | Zelenka | 347/233 |
| 6,832,045 B2 | * | 12/2004 | Nakaya et al. | 396/548 |

* cited by examiner

Primary Examiner—Akm Enayet Ullah
Assistant Examiner—Kevin S. Wood
(74) Attorney, Agent, or Firm—Sughrue Mion, PLLC

(57) ABSTRACT

The present invention provides, in order to obtain a desired focal depth t in a range α of an acceptable increased amount of beam diameter, an exposure head is designed so that the ratio D/W of an output beam width D to a beam width W at the position where a digital micromirror device (DMD) is placed satisfies the following formula:

$$\frac{D}{W} \leq \frac{\frac{\alpha \times M}{2 \times t} - \frac{K \times \lambda}{a}}{\theta}.$$

17 Claims, 18 Drawing Sheets

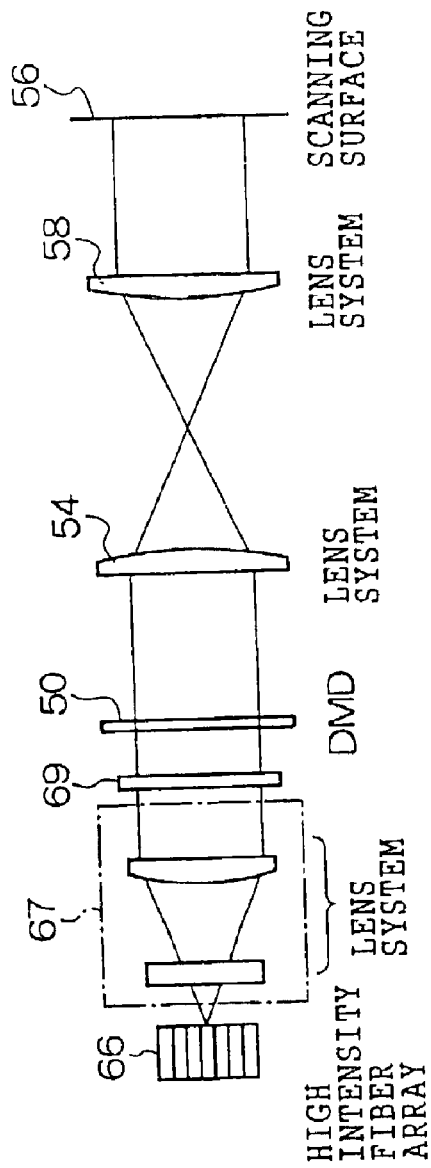
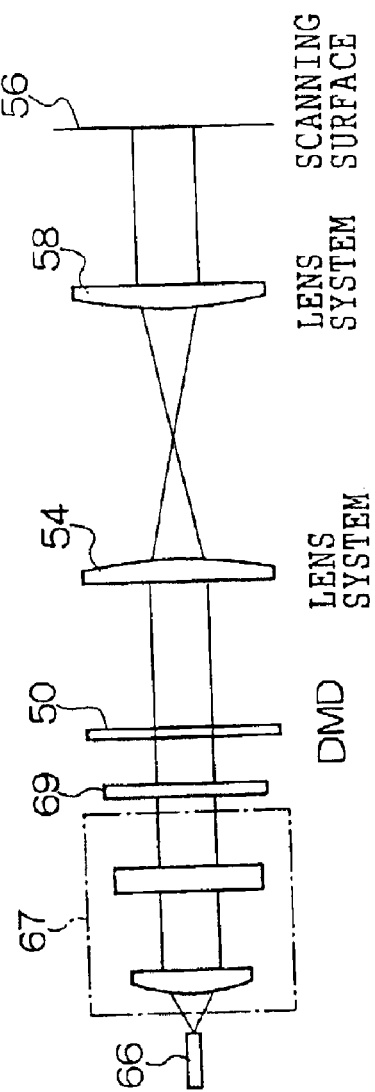

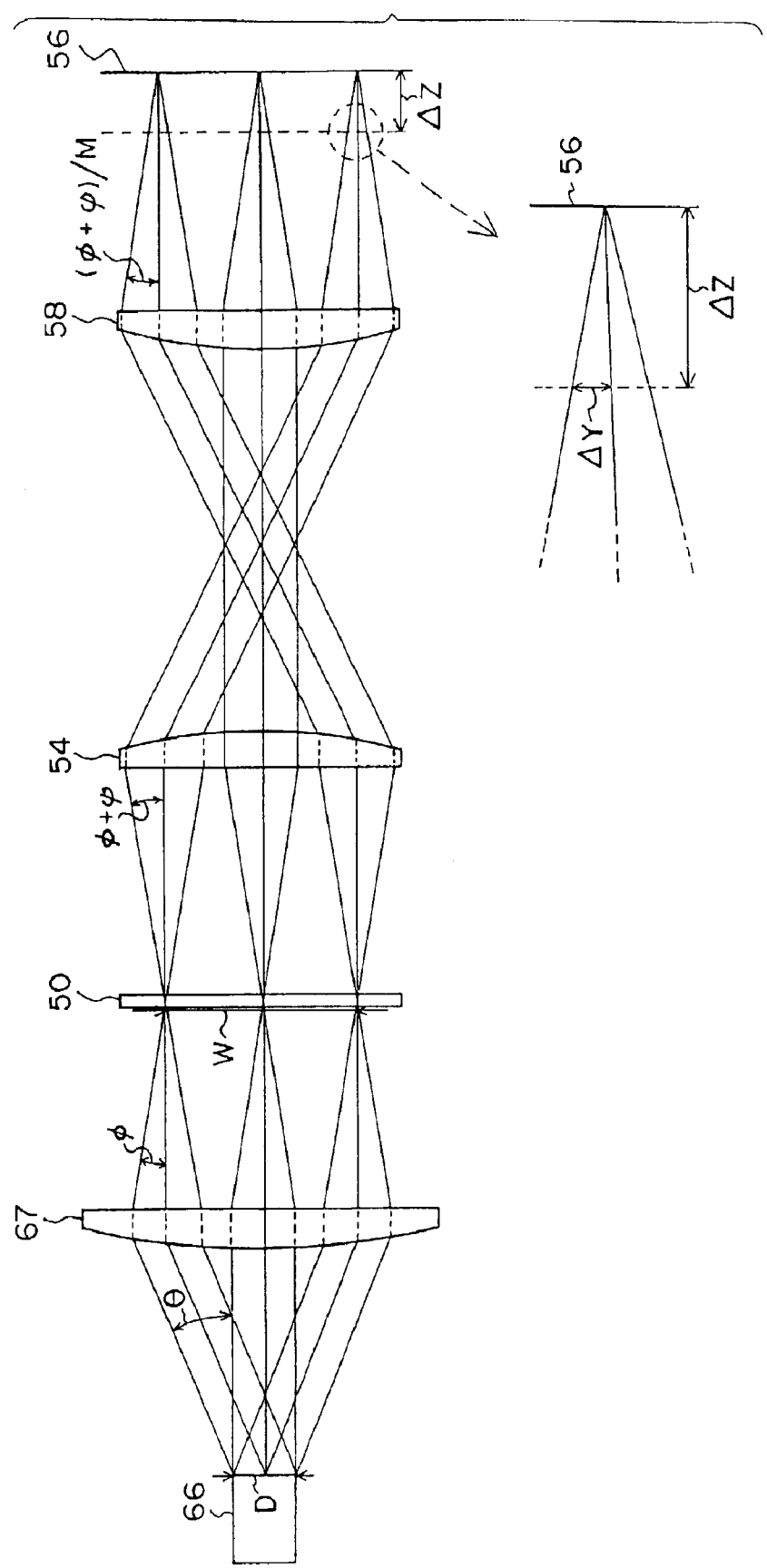

EXPOSURE HEAD

BACKGROUND OF THE INVENTION

1. Field of the Invention

The present invention relates to an exposure head and in particular to, an exposure head that exposes a photosensitive material with light beam which is modulated, according to image data, by a digital micromirror device (DMD).

2. Description of the Related Art

Conventionally, a DMD is a mirror device in which a large number of micromirrors with angles of their reflection surfaces being varied according to control signals are arranged two-dimensionally on a semiconductor substrate such as a silicon or the like. An exposure device using this DMD is structured, as shown in FIG. 15, by a light source 1 for irradiating laser light, a lens system 2 for collimating the laser light irradiated from the light source 1, a DMD 3 disposed at a substantial focus position of the lens system 2 and lens systems 4 and 6 for imaging the laser light reflected by the DMD 3 onto a scanning surface 5. According to such exposure device, each of the micromirrors for the DMD 3 is on-off controlled by an unillustrated control device depending on a control signal generated according to image data or the like in order to modulate laser light, whereby image exposure is performed by the modulated laser light.

The light source 1 is structured as follows. Namely, as shown in FIG. 16, a plurality of units each of which includes a single semiconductor laser 7, a single multi-mode optical fiber 8 and a pair of collimator lenses 9 for collimating laser light irradiated from the semiconductor laser 7 to bind on the end surface of the multi-mode optical fiber 8 are placed and a plurality of the multi-mode optical fibers 8 are bundled, so that a bundled fiber light source is formed.

A laser with around 30 mW of output is usually used for the semiconductor laser 7. An optical fiber with 50 $\mu$m of core diameter, 25 $\mu$m of clad diameter and 0.2 of NA (numerical aperture) is used for the multi-mode optical fiber 8. Thus, in order to obtain about 1 W of output, 48 (8×6) multi-mode optical fiber units 8 each of which has the above-described structure must be bundled, and the diameter of luminous point is about 1 mm.

According to conventional light sources, however, there arise problems that the diameter of luminous point becomes large when a plurality of optical fibers are bundled and thus sufficient focal depth cannot be obtained in a case in which exposure heads with high resolution are to be structured. Especially when only a part of DMD area is used, laser light must be condensed because the laser light is to be irradiated on a narrow area. As a result, sufficient focal depth cannot be obtained.

There is provided a method in which a focal depth is adjusted by performing autofocus by moving an imaging lens. Nevertheless, if an autofocus mechanism is provided, demerits such as an increase in costs and deterioration of vibration resistance characteristic may occur.

The invention was developed in order to solve the above-described problems and an object of the invention is to provide an exposure head that is capable of obtaining deep focal depth without providing an autofocus mechanism.

SUMMARY OF THE INVENTION

In order to accomplish the aforementioned object, according to a first aspect of the present invention, there is provided an exposure head which is moved relative to an exposed surface in a direction orthogonal to a predetermined direction, comprising: a laser device which has a plurality of fiber light sources for emitting laser light incident from optical-fiber incident ends thereof, from output ends thereof, and in which luminous points at the optical-fiber output ends of the plurality of fiber light sources are arranged; a modulation means which is capable of changing a modulation state of laser light, in accordance with a control signal, for each of pixels thereon which have been arranged in a two dimensional manner; and an optical system for imaging laser light outputted from the laser device and modulated at pixel portions of the modulation means onto the exposed surface, wherein parameters defined as follows satisfy the following formula.

$$\frac{D}{W} \leq \frac{\frac{a \times M}{2 \times t} - \frac{K \times \lambda}{\alpha}}{\theta}$$

$\lambda$: the wavelength of laser light
$\theta$: the angle of beam outputted from optical fiber that is derived by a numerical aperture (NA) of optical fiber according to the following formula $\theta = \sin^{-1}(NA)$ D: the width of beam outputted from the laser device
W: the beam width at the position of the modulation means (at the irradiated surface)
a: the size of one pixel on the modulation means
K: a coefficient determined by beam characteristics, K=1
M: the magnification of imaging optical system
t: required focal depth
$\alpha$: acceptable increased amount of beam diameter According to the exposure head of this aspect, by designing an exposure head so that the ratio D/W of the output beam width D to the beam width W at the position where the DMD is placed satisfies a predetermined relational formula in relation to parameters such as the required focal depth t, the acceptable increased amount $\alpha$ of beam diameter, the outputted beam angle $\theta$, the imaging magnification M of imaging optical system, the wavelength $\lambda$ of laser light, the characteristic coefficient K and the size a of one pixel on the modulation means (a spatial light modulation element), the exposure head which has the desired focal depth t in the range of the acceptable increased amount $\alpha$ of beam diameter can be realized. Namely, deep focal depth can be obtained without providing an autofocus mechanism.

According to a second aspect of the invention, a DMD (digital micromirror device) can be used as the modulation means in the exposure head.

According to a third aspect of the present invention, in order to accomplish high intensity laser device for the exposure head, an optical fiber in which a core diameter thereof is uniform and a clad diameter thereof at the output end is smaller than that at the incident end is preferably used as the fiber light source.

According to a fourth aspect of the invention, a fiber light source (a multiplexing laser light source) that multiplexes a plurality of laser lights to make the resultant multiplexed light incident onto each of the optical fibers is preferably used.

Because of using the multiplexing laser light source, fiber light sources structuring the laser device may have high outputs, and such high output can be obtained by less number of fibers. Consequently, higher intensity and reduction in costs can be accomplished.

According to a fifth aspect of the invention, the exposure head is preferably structured so that a value represented by the following formula in the predetermined direction is substantially equal to a value represented by the following formula in a direction orthogonal to the predetermined direction.

$$\frac{\theta \times D}{W} + \frac{K \times \lambda}{a}$$

In a case in which the modulation means is a DMD, for example, the above formula represents the divergence angle for light reflected by the DMD. If the value in the longer side direction of the DMD is substantially equal to the value in the shorter side direction thereof, a focal depth in the longer side direction of the DMD may be substantially equal to a focal depth in the shorter side direction thereof. As a result, exposure can be performed with high precision.

According to a sixth aspect of the invention, the exposure head of the invention may comprise a laser device in which a plurality of luminous points are arranged with predetermined intervals therebetween. Namely, the exposure head which is moved relative to an exposed surface in a direction orthogonal to a predetermined direction, comprises a laser device in which a plurality of luminous points are arranged in a predetermined direction with predetermined intervals therebetween; a modulation means which is capable of changing a modulation state of laser light, in accordance with a control signal, for each of pixels thereon which have been arranged in a two dimensional manner; and an optical system for imaging laser light outputted from the laser device and modulated at pixel portions of the modulation means onto the exposed surface, wherein parameters defined as follows satisfy the following formula.

$$\frac{D_A}{W} \leq \frac{\frac{\alpha \times M}{2 \times t} - \frac{K \times \lambda}{a}}{\theta_A}$$

$\lambda$: the wavelength of laser light
$\theta_A$: the angle of beam outputted from luminous points
$D_A$: the total width of beams outputted from all luminous points
W: the beam width at the position of the modulation means (at the irradiated surface)
a: the size of one pixel on the modulation means
K: a coefficient determined by beam characteristics, K=1
M: the magnification of imaging optical system
t: required focal depth
$\alpha$: acceptable increased amount of beam diameter It should be noted that a DMD (digital micromirror device can be used as the modulation means in the aforementioned exposure head).

BRIEF DESCRIPTION OF THE DRAWINGS

FIG. 6A is a side view in the case in which an appropriate area of DMD is used.

FIG. 6B is a cross-sectional view in a sub-scanning direction along an optical axis shown in FIG. 6A.

FIG. 7 is an explanatory view for explaining parameters used in the invention.

DETAILED DESCRIPTION OF THE INVENTION

Embodiments of an exposure head of the present invention will be described hereinafter in detail with reference to the drawings.

(First Embodiment)

[Structure of Exposure Head]

Figure 1:
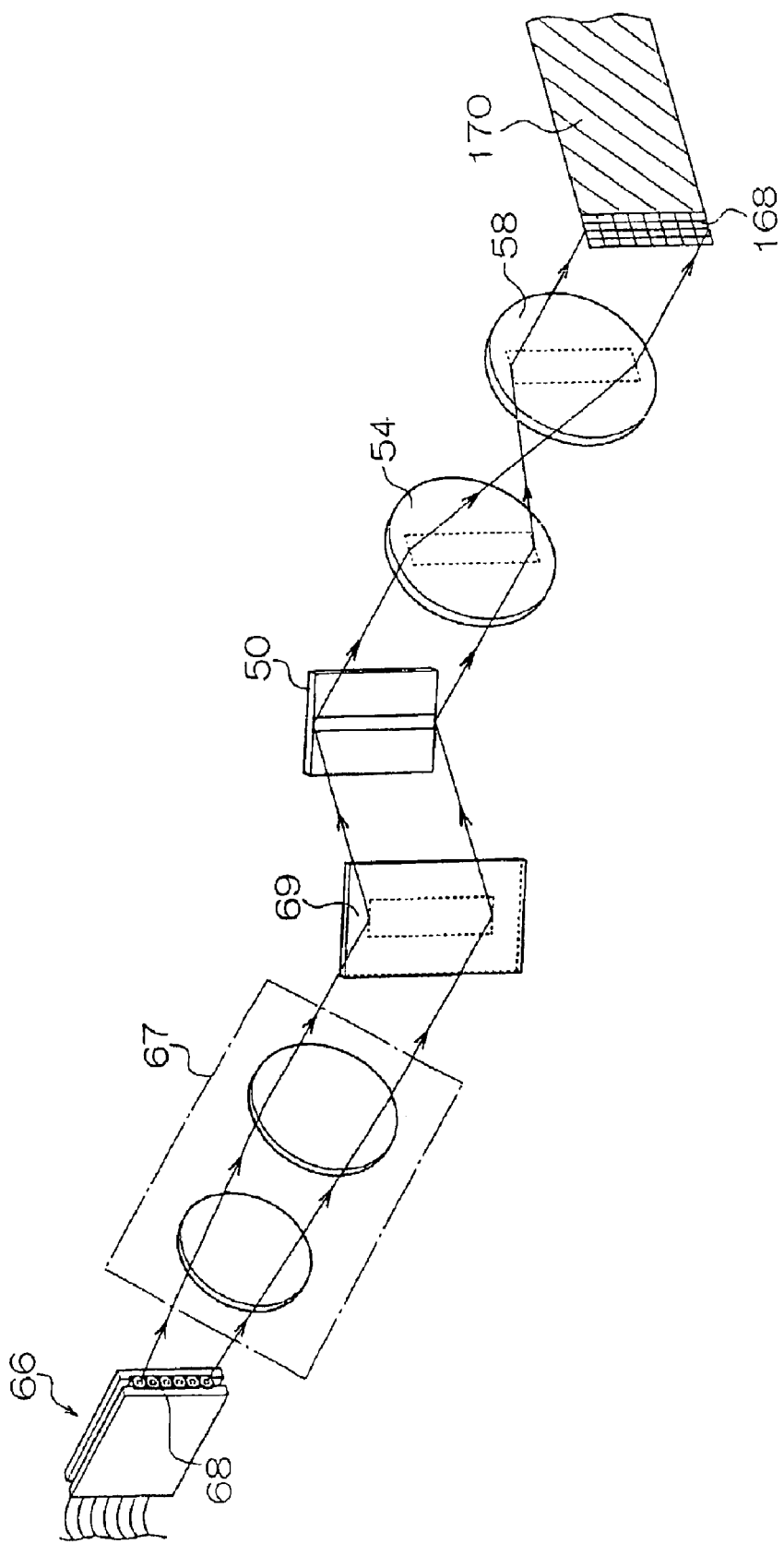
FIG. 1 is a perspective view of the schematic structure of an exposure head relating to a first embodiment.

An exposure head relating to the present embodiment includes, as shown in FIG. 1, a digital micromirror device (DMD) 50 serving as a modulation means (a spatial light modulation element) for modulating, on a pixel-by-pixel basis, light beam incident thereon according to image data. The DMD 50 is connected to an unillustrated controller that includes a data processing section and a mirror drive control section. In the data processing section of the controller, a control signal for drive-controlling each of micromirrors within an area of the DMD 50 to be controlled, of the exposure head, is generated on a basis of inputted image data. The area to be controlled will be described later. In the mirror drive control section, on a basis of the control signal generated in the image data processing section, the angle of the reflection surface of each of the micromirrors in the DMD 50 is controlled at the exposure head. The control of the angle of the reflection surface will be described later.

Successively disposed at the light-incident side of the DMD 50 are an illumination light source 66 with a laser-outputting portion in which two rows of optical-fiber output end portions (luminous points) are arranged along a direction corresponding to a longer side of the DMD 50, a lens system 67 for correcting the laser light outputted from the illumination light source 66 to condense on the DMD, and a mirror 69 for reflecting the laser light which has transmitted through the lens system 67 toward the DMD 50.

The lens system 67 is formed of a lens system for making laser light outputted from the illumination light source 66 parallel light, a lens system for correcting the parallel laser light so as to have uniform light amount distribution and a condenser lens system for condensing the laser light with the light amount distribution thereof having been corrected onto the DMD. Lens systems 54 and 58 for imaging the laser light reflected by the DMD 50 onto a scanning surface (exposed surface) 56 are disposed at the light-reflecting side of the DMD 50. The lens systems 54 and 58 are disposed so that the DMD 50 is conjugated with the exposed surface 56.

Figure 2:
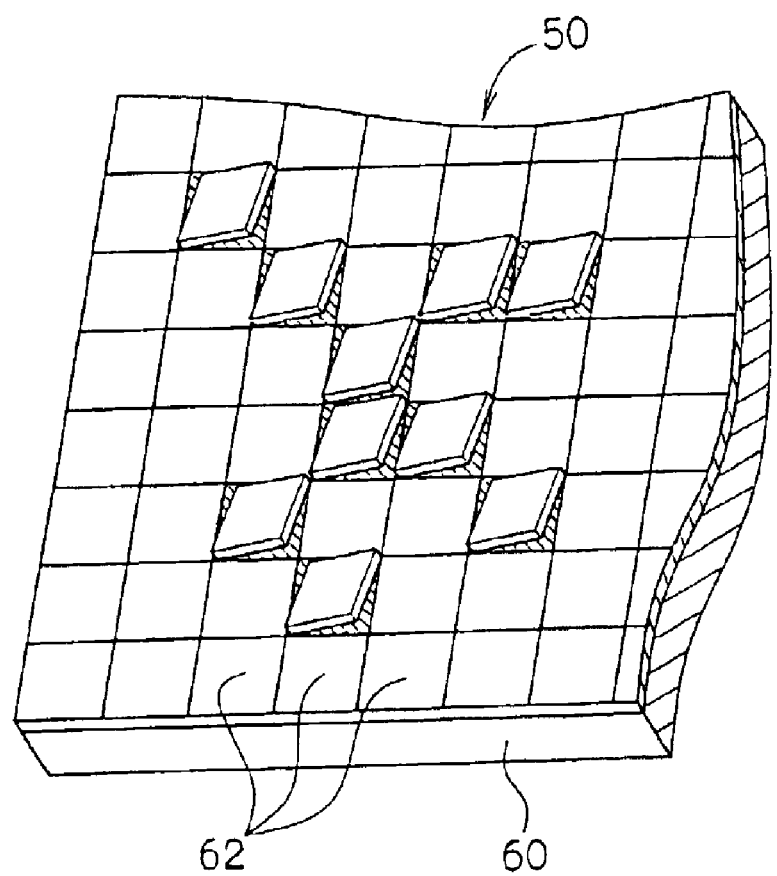
FIG. 2 is a partial enlarged view illustrating the structure of a digital micromirror device (DMD).

The DMD 50 is, as shown in FIG. 2, a mirror device in which micromirrors 62 are placed on an SRAM cell (memory cell) 60 by being supported by poles and a large number (e.g., 600×800) of micromirrors constituting pixels are arranged in a lattice manner. When a digital signal is written into the SRAM cell 60 of the DMD 50, each of the micromirrors 62 supported by the poles is diagonally inclined with respect to the side of substrate on which the DMD 50 is placed within the range of ±β degrees (e.g., ±10 degrees). On-off control for each of the micromirrors 62 is performed by the unillustrated controller connected to the DMD 50.

Figure 3A:
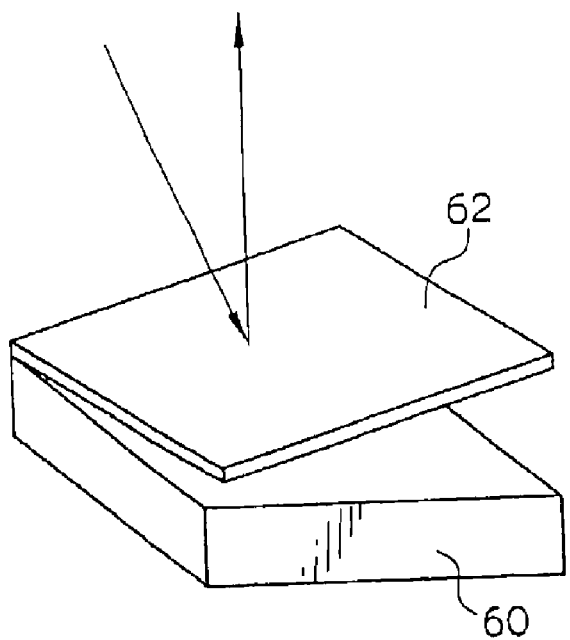
FIGS. 3A and 3B are explanatory views for explaining the operations of the DMD.
Figure 3B:
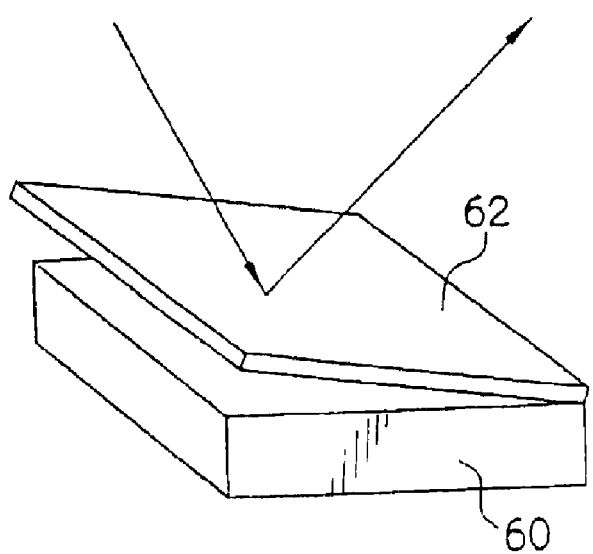

FIG. 3A shows the state that the micromirror 62 is in an "on" state (which state will be referred to as "an on state", hereinafter) and inclined by ±β degrees. FIG. 3B shows the state that the micromirror 62 is in an "off" state (which state will be referred to as "an off state", hereinafter) and inclined by −β degrees. Thus, by controlling inclination of the micromirrors 62 on pixels of the DMD 50 as shown in FIG. 2, according to an image signal, light incident on the DMD 50 is reflected in directions that the micromirrors 62 are inclined.

Figure 4:
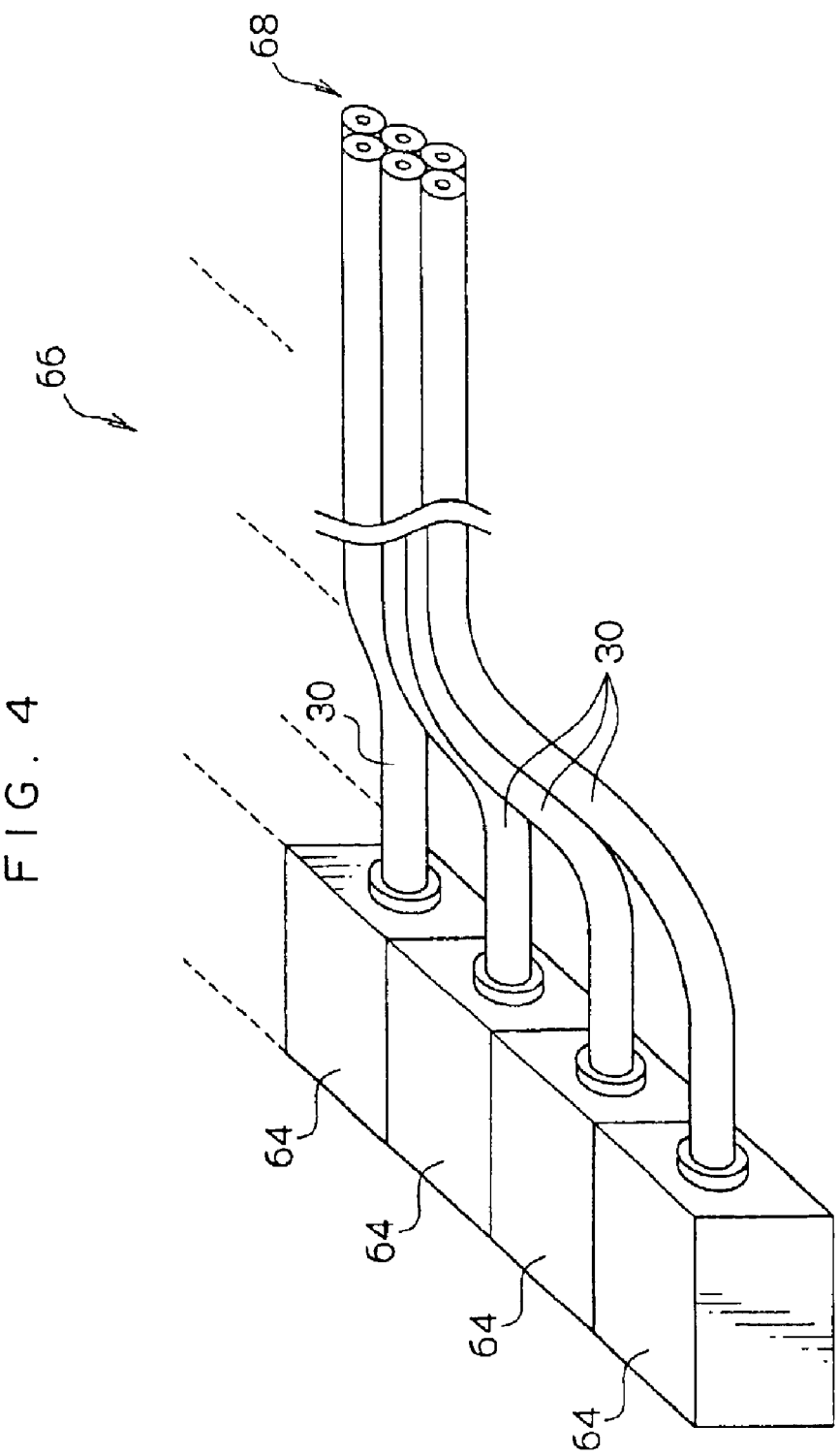
FIG. 4 is a perspective view illustrating the structure of an illumination light source.

As shown in FIG. 4, the illumination light source 66 has a plurality of (six in this example) laser modules 64. One end of a multi-mode optical fiber 30 is connected to each of the laser modules 64. The other end of the multi-mode optical fiber 30 is drawn from a package for the laser module 64. In this way, a laser-outputting portion 68 in which six luminous points are arranged so that three points are arranged in a longer side direction of the DMD 50 and two points are arranged in a shorter side direction thereof is structured. When the output of each of the luminous points for the illumination light source 66 is 180 mW, the output of the laser-outputting portion 68 in which six luminous points are arranged is about 1 W (=180 mW×6).

[Operation of Exposure Head]

Next, the operation of the above-described exposure head will be described.

When laser light is irradiated from the illumination light source 66 to the DMD 50, each of the micromirrors of the DMD 50 is on-off controlled by the unillustrated controller. Laser light reflected when the micromirrors of the DMD 50 are in an on state is imaged onto the exposed surface 56 of a photosensitive material by the lens systems 54 and 58. Laser light outputted from the illumination light source 66 is turned on or off on a pixel-by-pixel basis, so that the photosensitive material is exposed with light on a pixel unit (exposure area 168) basis which unit having the substantially same number of pixels as pixels used in the DMD 50. The photosensitive material is moved by unillustrated movement means at a fixed speed, whereby the photosensitive material is sub-scanned by the exposure head in the direction opposite to the direction in which the photosensitive material is moved and. As a result, an exposed area 170 is formed in a band shape.

Figure 5A:
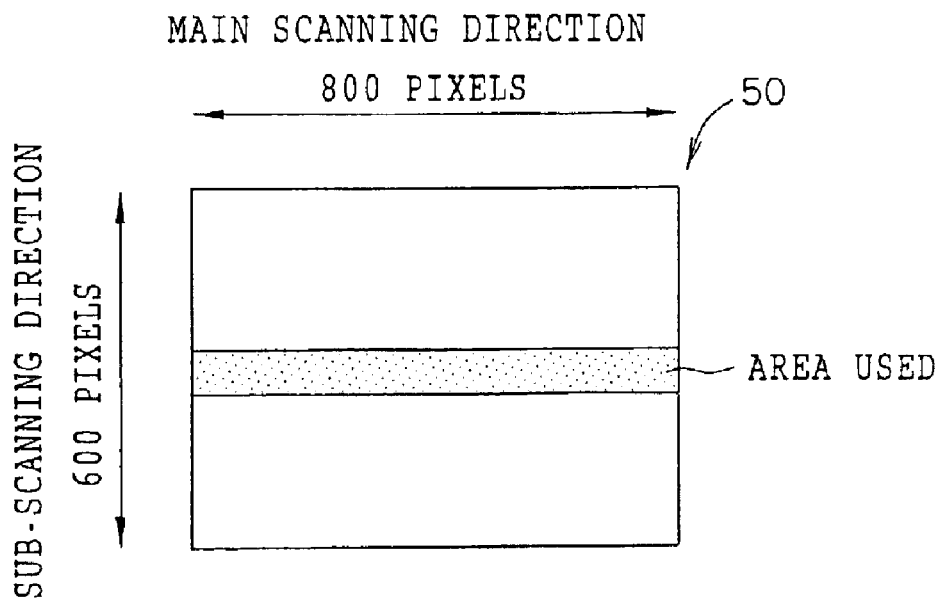
FIG. 5A is a view illustrating the example of the area of the DMD used.
Figure 5B:
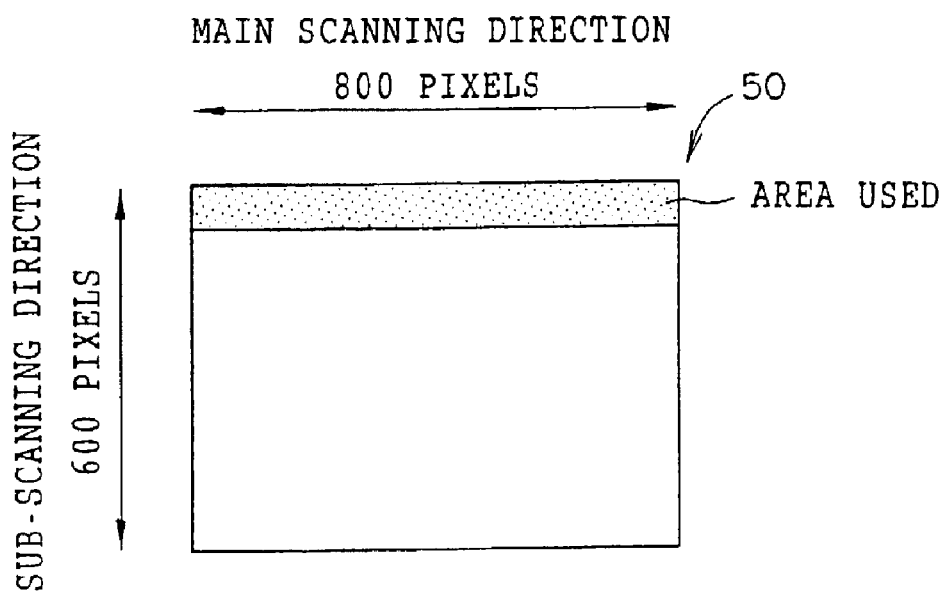
FIG. 5B is a view illustrating another example of the area of the DMD used.

600 micromirror rows are arranged in the DMD 50 in a sub-scanning direction. In each row, 800 micromirrors are arranged in a main scanning direction. Control may be performed so that only a part of the micromirror rows (e.g., only 800×50 rows) is driven by the controller. As shown in FIG. 5A, the micromirror row placed at the central portion of the DMD 50 may be used. Alternatively, the micromirror row placed at the end portion of the DMD 50 may be used as shown in FIG. 5B. Further, if a part of the micromirrors is damaged, micromirrors rows without damages may be used. Namely, micromirror rows used may be appropriately changed depending on conditions.

There is a limit in data processing speed for the DMD 50. A modulation speed per line is determined in proportion to the number of pixels used. Thus, the modulation speed per line is increased by using only a part of micromirror rows. In the case of an exposure method that an exposure head is successively moved relative to an exposure surface, all of pixels in a sub-scanning direction need not to be used.

For example, if 300 micromirror rows of 600 micromirror rows are used, modulation per line may be performed twice faster as compared to the case of using all 600 micromirror rows. If 200 micromirror rows of 600 micromirror rows are used, the modulation per line may be performed three times faster as compared to the case of using all 600 micromirror rows. Namely, exposure can be completed for 17 seconds upon an area with 500 mm of sub-scanning direction width. Further, if 100 micromirror rows of 600 micromirror rows are used, the modulation per line may be performed six times faster as compared to the case of using all 600 micromirror rows. Namely, exposure can be completed for nine seconds upon the area with 500 mm of sub-scanning direction width.

The number of micromirror rows used, i.e., the number of micromirrors arranged in a sub-scanning direction is preferably in the range of 10 to 200 and more preferably in the range of 10 to 100. The area of a micromirror corresponding to a pixel is 15 μm×15 μm. When converting into the area used of the DMD 50, areas of 12 mm×150 μm to 12 mm×3 mm are preferable and areas of 12 mm×150 μm to 12 mm×1.5 mm are more preferable.

When the number of micromirror rows used is in the aforementioned ranges, as shown in FIGS. 6A and 6B, laser light outputted from the illumination light source 66 may be made into substantial parallel light by the lens system 67 and then the parallel light may be irradiated onto the DMD 50. The area on which the DMD 50 irradiates laser light preferably coincides the area used in the DMD 50. If the irradiation area is larger than the area used, the efficiency of utilizing laser light is decreased. The sub-scanning direction diameter of light beam condensed onto the DMD 50 must be decreased by the lens system 67 according to the number of micromirrors arranged in a sub-scanning direction. If the number of micromirror rows used is smaller than 10, it is not preferable because the angle of luminous flux incident on the DMD 50 becomes large and a focal depth of light beam on the scanning surface 56 is decreased. 200 or smaller of micromirror rows are preferably used in view of modulation speed. The DMD is a reflection type spatial modulation element (modulation means). FIGS. 6A and 6B, however, show exploded views in order to explain optical relationships.

[Derivation of Relational Formulae]

According to the exposure head relating to the present embodiment, as shown in FIG. 7, parameters $\theta$, D, $\phi$, $\Psi$, W, $\Delta y$ and $\Delta z$ are defined. Namely, $\theta$ indicates the angle of beam outputted from each of optical fibers arranged in the beam-outputting portion of the illumination light source 66. D indicates the width of beam outputted from the illumination light source 66. $\phi$ indicates the angle formed by light outputted from the central luminous point among luminous points arranged in the illumination light source 66 along a predetermined direction and light outputted from the luminous point placed at the end of the illumination light source 66. $\Psi$ indicates a divergence angle formed by diffraction of light reflected by the DMD 50. W indicates a beam width at the position where the DMD 50 is placed (at the irradiated surface). $\Delta z$ indicates an error in a direction of focal depth and $\Delta y$ indicates an increased amount of beam diameter (one side) when $\Delta z$ indicates the focal depth direction error.

According to the present embodiment, in order to obtain a desired focal depth t in the range of the acceptable increased amount $\alpha$ of beam diameter, the exposure head is designed so that the ratio D/W of the outputting beam width D to the beam width W at the position where the DMD is placed satisfies the following relational formula (A).

$$\frac{D}{W} \leq \frac{\frac{\alpha \times M}{2 \times t} - \frac{K \times \lambda}{a}}{\theta} \quad (A)$$

In the above formula, parameters are defined as follows.
$\lambda$: the wavelength of laser light
$\theta$: the angle of beam outputted from the illumination light source that is derived from numerical aperture (NA) of optical fiber according to the following formula $$\theta = \sin^{-1}(NA)$$

D: the width of beam outputted from the illumination light source
W: the beam width at the position DMD is placed (at the irradiated surface)
a: the size of one pixel on DMD
K: a coefficient determined by beam characteristics, K=1
M: the magnification of imaging optical system A method for deriving the aforementioned relational formula will be described with reference to FIG. 7. The lens system 67 makes light from the illumination light source 66 substantial parallel light and is disposed so that luminous points at the illumination light source 66 substantially evenly illuminate the entire area used in the DMD 50. Luminous fluxes outputted from the luminous points illuminate the entire area used in the DMD 50. Thus, even if a part of laser modules structuring the illumination light source 66 is broken, a light amount distribution of laser light irradiated onto the DMD 50 cannot be uneven. Under such conditions, the angle $\phi$ (rad) formed by light outputted from the central luminous point among a plurality of luminous points arranged in a predetermined direction and light outputted from the luminous point placed at the end portion of the light source 66 is represented by the following formula by using the angle $\theta$ of outputted beam (rad), the output beam width D (mm) and the beam width W (mm) at the position where the DMD is placed.

$$\phi = \frac{\theta \times D}{W}$$

Beam to be irradiated onto the DMD 50 is substantially parallel beam but has the angle of $\pm \phi$ (rad). Light reflected by the DMD 50 is diverged by a divergence angle $\Psi$ (rad) because of diffraction effect caused by influence of the size of pixels in the DMD 50. Accordingly, the divergence angle of the light reflected by the DMD 50 is given by the following formula.

$$\phi + \Psi$$

A diffraction divergence angle $\Psi$ (rad) when a pitch of diffraction grating (size of a pixel in the DMD 50) is a ($\mu$m) and the wavelength of incident laser light is $\lambda$ ($\mu$m) is given by the following formula. K is a coefficient determined by beam characteristics and is usually 1.

$$\psi = \frac{K \times \lambda}{a}$$

When the imaging magnification for the imaging optical systems 54 and 58 is indicated by M, the divergence angle for beam illuminating onto the exposed surface 56 is given by the following formula.

$$\frac{(\phi - \psi)}{M}$$

When the focal depth direction error is indicated by $\Delta z$, the relationship between the increased amount $\Delta y$ of beam diameter (one side) and the error $\Delta z$ is given by the following formula by using the divergence angle for beam illuminating onto the exposed surface 56.

$$\Delta y = \frac{(\phi + \psi) \times \Delta z}{M}$$

$$\frac{\Delta y}{\Delta z} = \frac{\frac{\theta \times D}{W} + \frac{K \times \lambda}{a}}{M}$$

Note that it is assumed that the required focal depth is indicated by t ($\mu$m) and the acceptable increased amount of beam diameter is indicated by $\alpha$ ($\mu$m). When the following formula is satisfied (i.e., when t<$\Delta z$), the required focal depth t can be obtained in the range of the acceptable increased amount $\alpha$ of beam diameter. Here, a=2×$\Delta y$.

$$\frac{a}{t} \geq 2 \times \frac{\frac{\theta \times D}{W} + \frac{K \times \lambda}{a}}{M}$$

By transforming the above formula, the relational formula (A) can be obtained.

Namely, by designing the exposure head so that the ratio D/W of the output beam width D to the beam width W at the position where the DMD is placed satisfies the above relational formula (A) in relation to the parameters such as the required focal depth t, the acceptable increased amount $\alpha$ of beam diameter, the angle $\theta$ of outputted beam, the imaging magnification M of imaging optical systems, the wavelength λ of laser light, the characteristic coefficient K and the size "a" of a pixel in the DMD, the exposure head which has a desired focal depth t in the range of the acceptable increased amount α of beam diameter can be realized.

In the above-described exposure head, it is assumed that the wavelength λ of laser light is 0.4 μm, the size a of one pixel in the DMD 50 is 20 μm, the magnification M for imaging optical systems is 1, the characteristic coefficient K is 1 and the acceptable increased amount α of beam diameter is 2 μm. The drive area in the DMD 50 is 16 mm×1 mm (800 pixels×50 pixels). Micromirrors corresponding to 800 pixels are used in a longer side direction of the DMD. Micromirrors corresponding to 50 pixels are used in a shorter side direction of the DMD. Correspondingly, the beam width W in the longer side direction of the DMD at the position where the DMD is placed is 17.6 mm and the beam width W in the shorter side direction of the DMD is 1.1 mm.

Figure 8A:
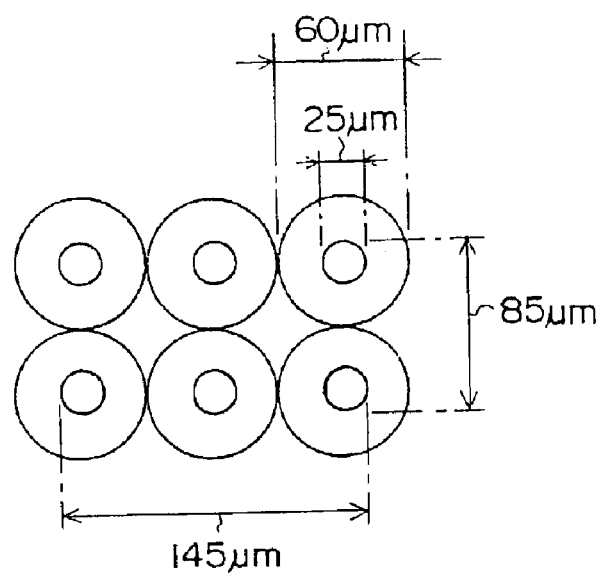
FIG. 8A is a plan view illustrating the arrangement of luminous points at the output end of the illumination light source used in the first embodiment, and the output beam width thereof.

Under such conditions, in order to satisfy the above relational formula, the clad diameter of the multi-mode optical fiber 30 is to be 60 μm, the core diameter is to be 25 μm and NA is 0.2. Further, the output beam width D in the longer side direction of the DMD is to be 0.145 mm, the output beam width D in the shorter side direction of the DMD is to be 0.085 mm and the angle θ of outputted beam is to be 0.2 rad, with the beam being outputted from the illumination light source 66 in which three luminous points are arranged in the longer side direction of the DMD and two luminous points are arranged in the shorter side direction of the DMD, as shown in FIG. 8A. The output beam width D in the shorter side direction of the DMD is 0.085 mm and the angle θ of outputted beam is 0.2 rad. Thus, as shown in Table 1, long focal depths such as 47 μm in the longer side direction of the DMD and 30 μm in the shorter side direction of the DMD can be realized.

TABLE 1

|  | longer side direction of DMD | shorter side direction of DMD |
|---|---|---|
| λ | 0.4 μm | 0.4 μm |
| θ | 0.2 rad | 0.2 rad |
| D | 0.145 mm | 0.085 mm |
| W | 17.6 mm | 1.1 mm |
| WD | 16 mm (800 pixels) | 1 mm (50 pixels) |
| a | 20 μm | 20 μm |
| M | 1 | 1 |
| α | 2 μm | 2 μm |
| Obtained focal depth | 47 μm | 30 μm |

Figure 8B:
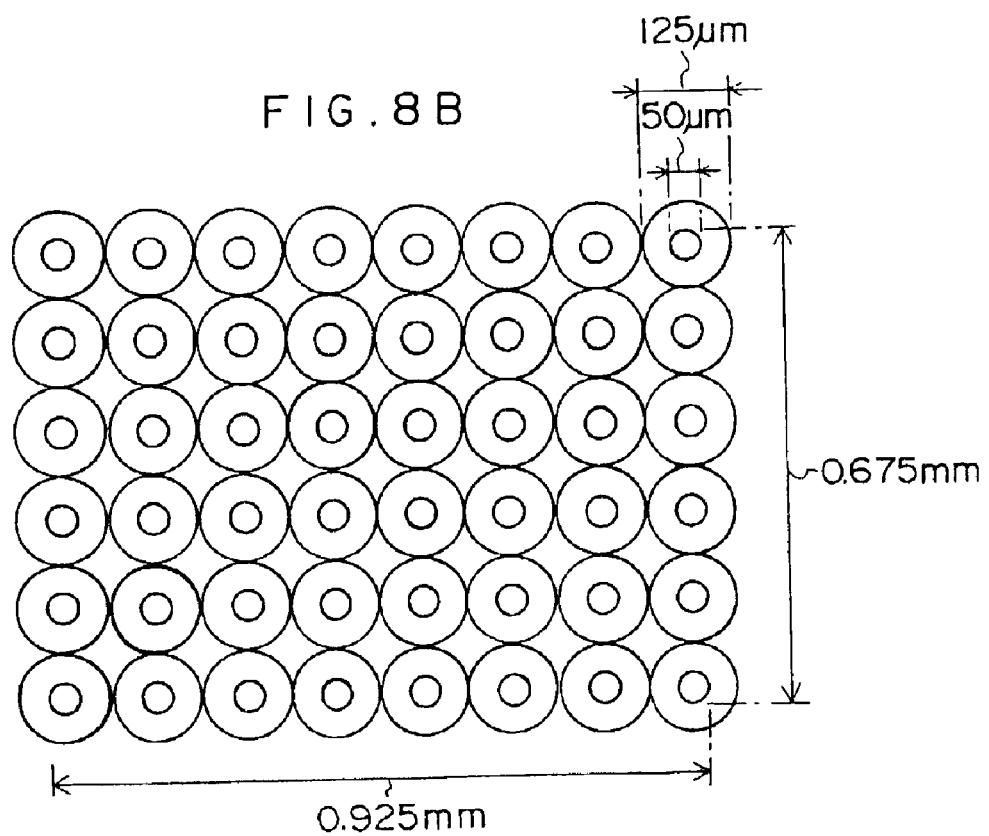
FIG. 8B is a plan view illustrating the arrangement of luminous points at the output end of the illumination light source relating to a comparative example, and the output beam width thereof.

On the other hand, in a case of using a fiber light source structured by binding light outputted from a semiconductor laser with around 30 mW of output into a multi-mode optical fiber which has 50 μm of core diameter, 125 μm of clad diameter and 0.2 of NA, in order to obtain about 1 W of output, 8×6, i.e., 48 multi-mode optical fibers must be bundled as shown in FIG. 8B. In this case, the output beam width D in the longer side direction of the DMD is 0.925 mm and the output beam width D in the shorter side direction of the DMD is 0.675 mm. In order to obtain 17.6 mm of the beam width W in the longer side direction of the DMD at the position where the DMD 50 is placed and 1.1 mm of the beam width W in the shorter side direction of the DMD, as shown in the Table 2, the focal depth in the longer side direction of the DMD is 32 μm. However, the above relational formula is not satisfied in the case of the focal depth in the shorter side direction of the DMD, and the focal depth is 7 μm. Thus, an autofocus mechanism is required.

TABLE 2

|  | longer side direction of DMD | shorter side direction of DMD |
|---|---|---|
| λ | 0.4 μm | 0.4 μm |
| θ | 0.2 rad | 0.2 rad |
| D | 0.952 mm | 0.675 mm |
| W | 17.6 mm | 1.1 mm |
| WD | 16 mm (800 pixels) | 1 mm (50 pixels) |
| a | 20 μm | 20 μm |
| M | 1 | 1 |
| α | 2 μm | 2 μm |
| Obtained focal depth | 32 μm | 7 μm |

As described above, according to the present embodiment, by designing the exposure head so that the ratio D/W of the output beam width D to the beam width W at the position where the DMD is placed satisfies the predetermined relational formula in relation to parameters such as the required focal depth t, the acceptable increased amount α of beam diameter, the angle θ of outputted beam, the imaging magnification M for the imaging optical systems, the wavelength λ of laser light, the characteristic coefficient K and the size "a" of a pixel in the DMD, the exposure head which has the desired focal depth t in the range of the acceptable increased amount α of beam diameter can be realized. Namely, deep focal depth can be obtained without providing an autofocus mechanism.

According to the present embodiment, a high intensity illumination light source in which luminous points at optical-fiber output end portions of multiplexing laser light sources are arranged in a bundled manner is used for a light source for illuminating the DMD. Thus, an exposure head with high output and deep focal depth can be realized. Further, since the output of each of luminous points becomes large, the number of fibers needed in order to obtain a desired output is decreased, resulting in a decrease in costs for the exposure head.

(Second Embodiment)

According to an exposure head relating to a second embodiment, the arrangement of luminous points in an illumination light source is changed so that a divergence angle (i.e., φ+Ψ) for light reflected by a DMD that is represented by the following formula in a longer side direction of the DMD is equal to the divergence angle in the shorter side direction of the DMD. Because the second embodiment has the same structures as those in the first embodiment except for this point, descriptions thereof will be omitted.

$$\frac{\theta \times D}{W} + \frac{K \times \lambda}{a}$$

The drive area for the DMD 50 is 16 mm×1 mm (800 pixels×50 pixels). Similarly to the first embodiment, it is assumed that the beam width W in the longer side direction of the DMD at the position where the DMD 50 is placed is 17.6 mm and the beam width W in the shorter side direction of the DMD is 1.1 mm, in accordance with a ratio 16:1 of the longer side vs. the shorter side of the drive area for the DMD 50. In this case, when the ratio of the width D of beam outputted from the illumination light source 66 in the longer side direction of the DMD to the beam width in the shorter side direction of the DMD is 16:1, a condensing ratio by the lens system 67 in the longer side direction of the DMD is substantially equal to a condensing ratio by the lens system 67 in the shorter side direction of the DMD. Thus, the divergence angle for light reflected by the DMD in the longer side direction of the DMD is substantially equal to the divergence angle for light reflected by the DMD in the shorter side direction.

For example, when the illumination light source 66 is formed of low intensity fiber light sources each of which has 30 mW of output at its luminous point, 48 multi-mode optical fibers 30 must be bundled in order to obtain about 1 W of output. Assuming that the number of optical fibers to be bundled is 48, 48 luminous points at the laser-outputting portion of the illumination light source 66 may be arranged so that 48 luminous points are arranged in the longer side direction of the DMD and one luminous point is arranged in the shorter side direction of the DMD. Alternatively, 48 luminous points may be arranged so that 24 luminous points are arranged in the longer side direction of the DMD and two luminous points are arranged in the shorter side direction of the DMD. As a result, the ratio of the output beam width D in the longer side direction of the DMD to the output beam width D in the shorter side direction may made close to 16:1.

Figure 9:
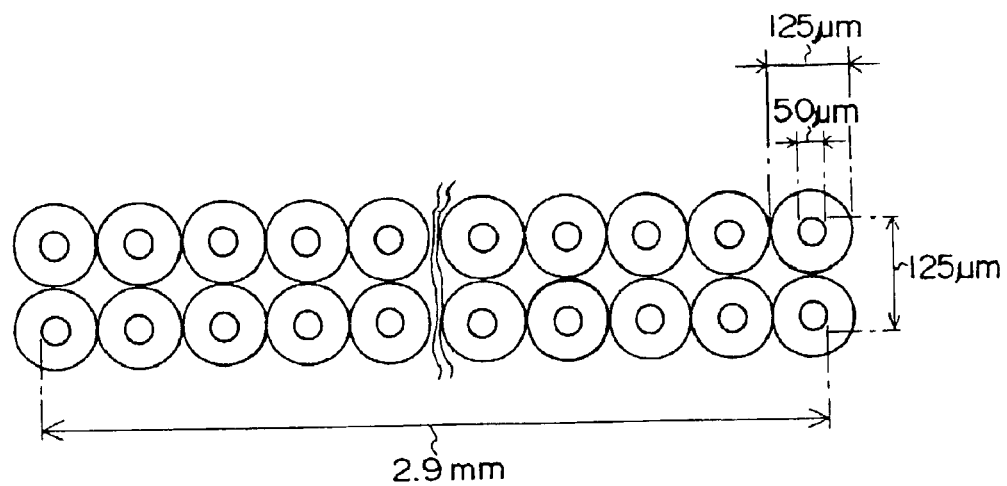
FIG. 9 is a plan view illustrating the arrangement of luminous points at the output end of the illumination light source used in a second embodiment, and the output beam width thereof.

It is assumed that the clad diameter of the multi-mode optical fiber 30 is 125 $\mu$m, the core diameter thereof is 50 $\mu$m and NA is 0.2. Then, as shown in FIG. 9, the width D of beam outputted in the longer side direction of the DMD from the illumination light source 66, in which 48 luminous points are arranged as two rows in the longer side direction of the DMD, is 2.9 mm and the output beam width D in the shorter side direction of the DMD is 0.175 mm. If the angle $\theta$ for outputted beam is 0.2 rad, as shown in the following Table 3, long focal depths such as 20 $\mu$m in the longer side direction of the DMD and 20 $\mu$m in the shorter side direction thereof can be realized.

TABLE 3

| | Case of using low intensity fiber light source | |
|---|---|---|
| | Longer side direction of DMD | Shorter side direction of DMD |
| $\lambda$ | 0.4 $\mu$m | 0.4 $\mu$m |
| $\theta$ | 0.2 rad | 0.2 rad |
| D | 2.9 mm | 0.175 mm |
| W | 17.6 mm | 1.1 mm |
| WD | 16 mm (800 pixels) | 1 mm (50 pixels) |
| a | 20 $\mu$m | 20 $\mu$m |
| M | 1 | 1 |
| $\alpha$ | 2 $\mu$m | 2 $\mu$m |
| Obtained focal depth | 20 $\mu$m | 20 $\mu$m |

As described above, according to the second embodiment, as in the first embodiment, deep focal depth can be obtained without providing an autofocus mechanism. Further, a focal depth obtained in the longer side direction of the DMD is substantially equal to a focal depth obtained in the shorter side direction and thus exposure can be performed with high precision.

(Third Embodiment)

An exposure head relating to a third embodiment has the same structures as those of the first embodiment except that, as in the second embodiment, the arrangement of luminous points in an illumination light source is changed so that the divergence angle for light reflected by the DMD in the longer side direction of the DMD is equal to the divergence angle for light reflected by the DMD in the shorter side direction thereof and the illumination light source is formed of high intensity fiber light sources. Thus, detailed descriptions thereof will be omitted.

Figure 10:
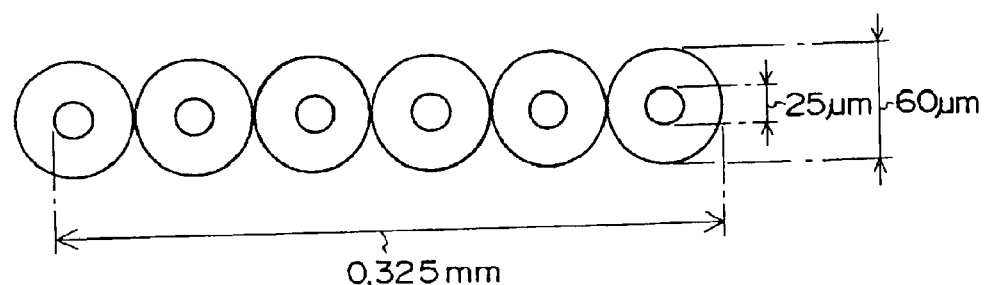
FIG. 10 is a plan view illustrating the arrangement of luminous points at the output end of the illumination light source used in a third embodiment, and the output beam width thereof.

It is assumed that, for example, that the illumination light source 66 is formed of high intensity fiber light sources each of which has 180 mW of output at its luminous point. In order to obtain about 1 W of output, six multi-mode optical fibers 30 must be arranged. When the number of optical fibers to be arranged is six, as shown in FIG. 10, six luminous points at the laser-outputting portion of the illumination light source 66 may be arranged so that six luminous points are arranged in the longer side direction of the DMD and one luminous point is arranged in the shorter side direction thereof. As a result, the ratio of the output beam width D in the longer side direction of the DMD to the output beam width D in the shorter side direction of the DMD may be made close to 16:1.

When the clad diameter of the multi-mode optical fiber 30 is 60 $\mu$m, the core diameter thereof is 25 $\mu$m and NA is 0.2, the width D of beam outputted in the longer side direction of the DMD from the illumination light source 66, in which six luminous points are arranged in the longer side direction of the DMD and one luminous point is arranged in the shorter side direction thereof is 0.325 mm, and the width D of beam outputted in the shorter side direction of the DMD from the same illumination light source 66 is 0.025 mm. If the angle $\theta$ for outputted beam is 0.2 rad, as shown in the following Table 4, long focal depths such as 44 $\mu$m in the longer side direction of the DMD and 41 $\mu$m in the shorter side direction thereof can be realized.

TABLE 4

| | Case of using high intensity fiber light source | |
|---|---|---|
| | longer side direction of DMD | shorter side direction of DMD |
| $\lambda$ | 0.4 $\mu$m | 0.4 $\mu$m |
| $\theta$ | 0.2 rad | 0.2 rad |
| D | 0.325 mm | 0.025 mm |
| W | 17.6 mm | 1.1 mm |
| WD | 16 mm (800 pixels) | 1 mm (50 pixels) |
| a | 20 $\mu$m | 20 $\mu$m |
| M | 1 | 1 |
| $\alpha$ | 2 $\mu$m | 2 $\mu$m |
| Obtained focal depth | 44 $\mu$m | 41 $\mu$m |

As described above, according to the third embodiment, as in the first embodiment, deep focal depth can be obtained without providing an autofocus mechanism. Especially according to the present embodiment, a high intensity illumination light source in which luminous points at the optical-fiber output end portions of multiplexing laser light sources are arranged in a bundled manner is used for a light source for illuminating onto the DMD. As a result, an exposure head with high output and deep focal depth can be realized.

Further, a focal depth in the longer side direction of the DMD is substantially equal to a focal depth in the shorter side direction thereof, and thus exposure can be performed with high precision.

[Structure of Laser Module]

Figure 11:
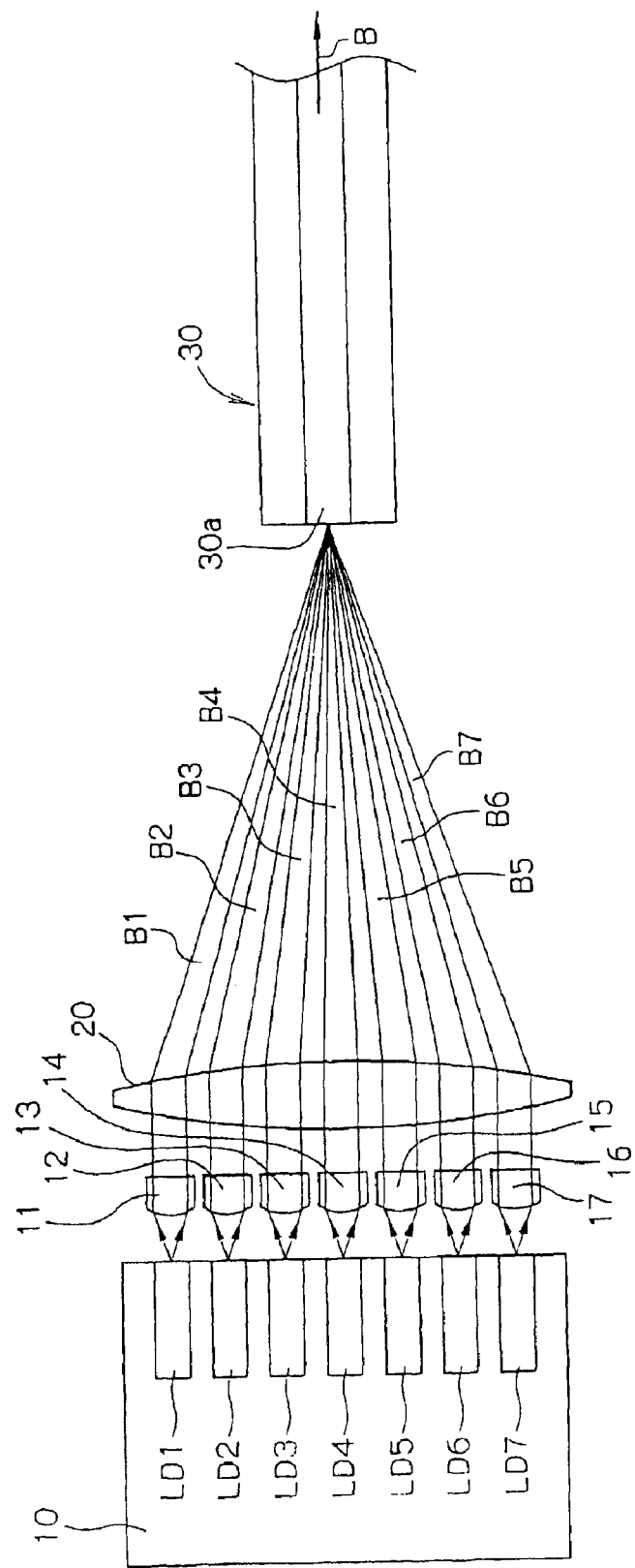
FIG. 11 is a plan view illustrating the structure of a multiplexing laser light source.

The laser module 64 formed of a high intensity fiber light source is structured by, for example, a multiplexing laser light source as shown in FIG. 11. The multiplexing laser light source is formed of a plurality of (e.g., seven) lateral multi-mode or single-mode GaN-based semiconductor laser chips LD1, LD2, LD3, LD4, LD5, LD6 and LD7 that are arranged on a heat block 10 and fixed thereto, collimator lenses 11, 12, 13, 14, 15, 16 and 17 provided so as to respectively correspond to the GaN-based semiconductor lasers LD1 to LD7, a condenser lens 20 and a multi-mode optical fiber 30. The number of the semiconductor lasers is not limited to seven.

The GaN-based semiconductor lasers LD1 to LD7 have a common oscillation wavelength (e.g., 405 nm) and a common maximum output (e.g., 100 mW in the case of multi-mode laser and 30 mW in the case of single-mode laser). Lasers with 350 nm to 450 nm of wavelength range and oscillation wavelength other than 405 nm may be used as the GaN-based semiconductor lasers LD1 to LD7.

Figure 12:
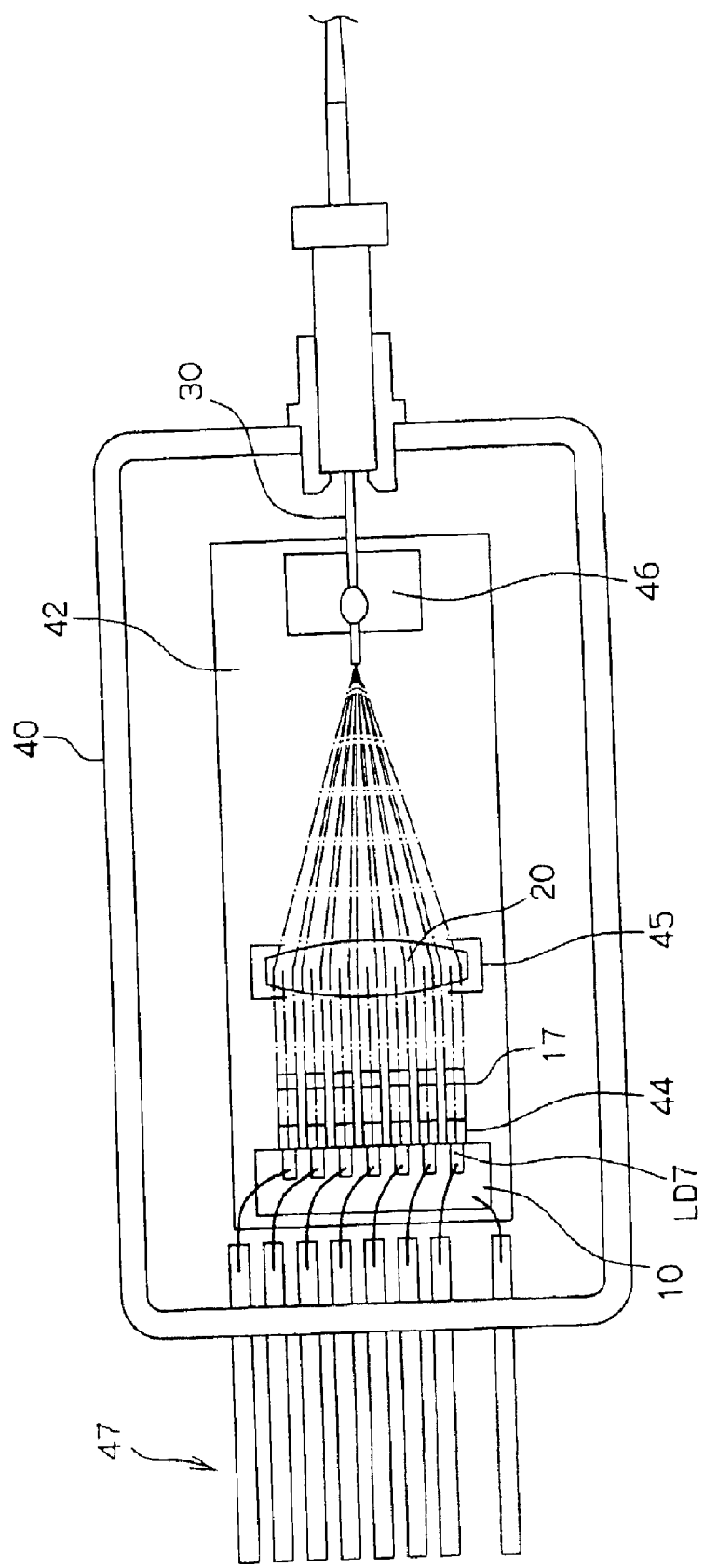
FIG. 12 is a plan view illustrating the structure of a laser module.
Figure 13:
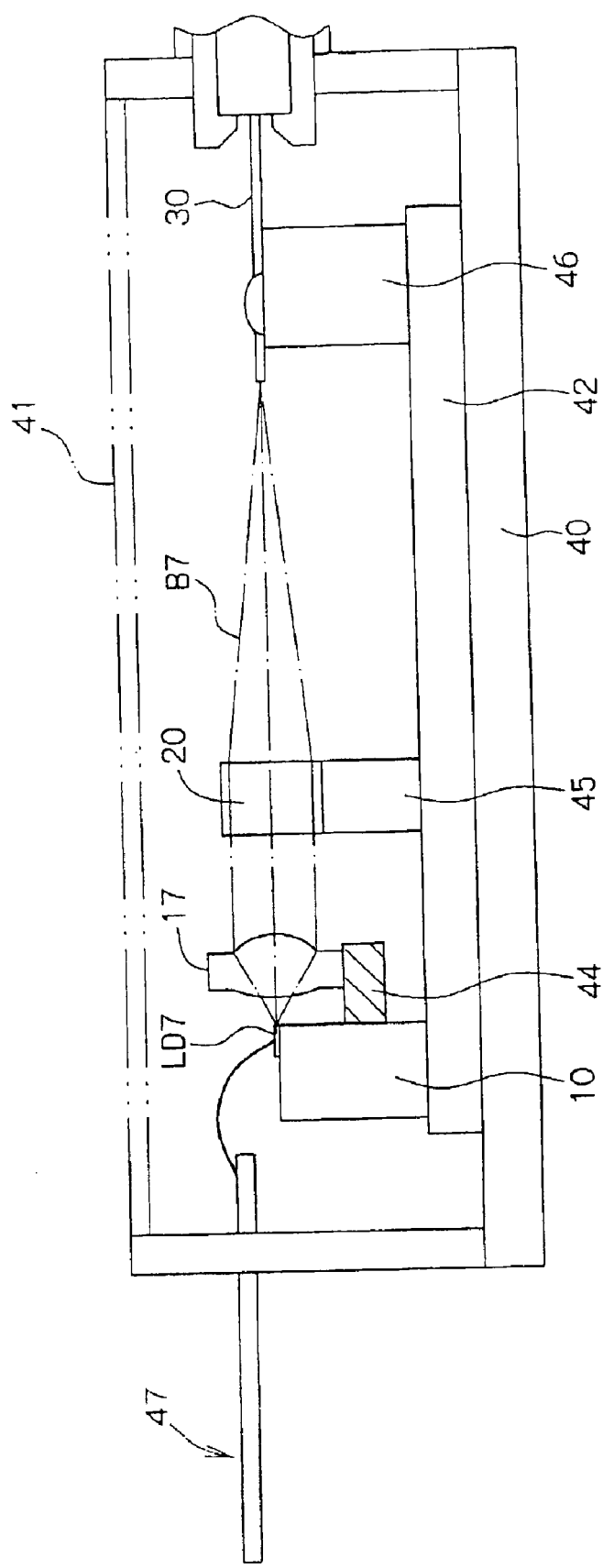
FIG. 13 is a side view of the structure of the laser module shown in FIG. 12.

The multiplexing laser light source with the above-described structure is accommodated together with other optical elements within a box-shaped package 40 with the top surface thereof being opened as shown in FIGS. 12 and 13. The package 40 has a package cover 41 formed so as to close the open surface. A sealing gas is introduced subsequent to a degassing treatment and the opening of the package 40 is closed by the package cover 41. As a result, the multiplexing laser light source is hermetically sealed within the closed space (sealed space) formed by the package 40 and the package cover 41.

A base plate 42 is fixed to the bottom surface of the package 40. The heat block 10, a condenser lens holder 45 for holding the condenser lens 20 and a fiber holder 46 for holding the incident end portion of the multi-mode optical fiber 30 are mounted on the top surface of the base plate 42. The output end portion of the multi-mode optical fiber 30 is drawn outside the package from an opening formed at the wall surface of the package 40.

A collimator lens holder 44 is mounted to the side surface of the heat block 10 and holds the collimator lenses 11 to 17. Openings are formed at the lateral wall surface of the package 40 and wirings 47 for supplying drive current to the GaN-based semiconductor lasers LD1 to LD7 are drawn outside the package through the openings.

Referring to FIG. 13, in order to avoid complication, the reference numeral is attached only to the GaN-based semiconductor laser LD7 among the plurality of GaN-based semiconductor lasers and to the collimator lens 17 among the plurality of collimator lenses.

Figure 14:
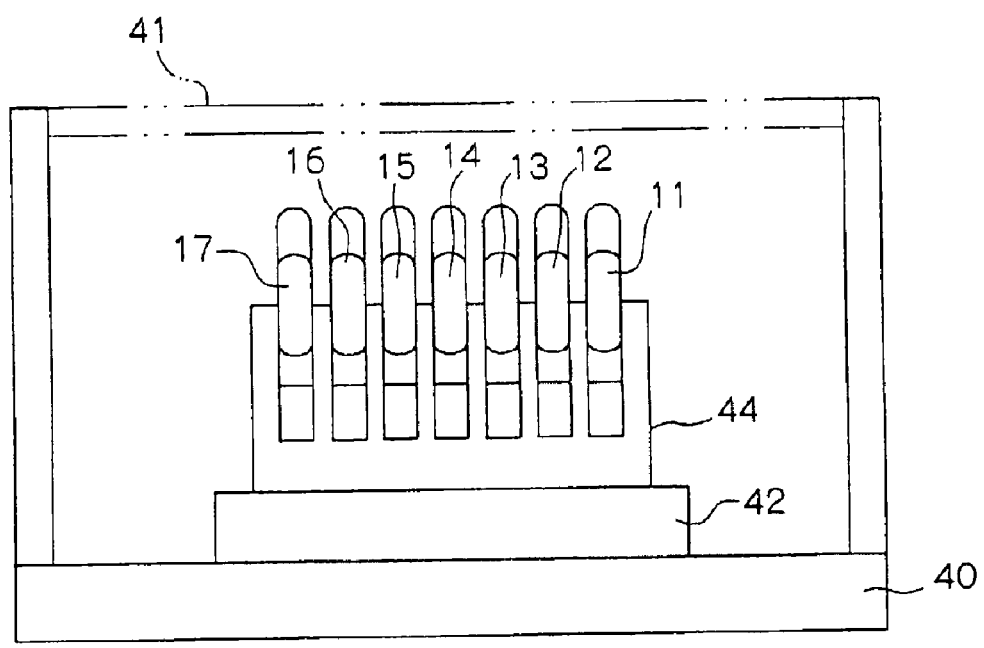
FIG. 14 is a partial side view of the structure of the laser module shown in FIG. 12.
Figure 15:
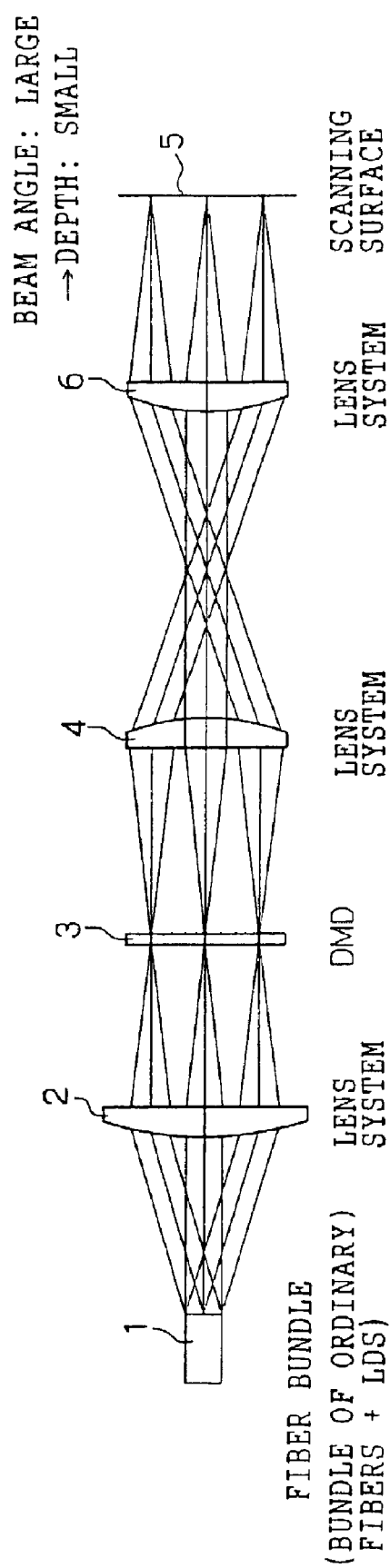
FIG. 15 is a cross-sectional view along an optical axis, illustrating the structure of an exposure head that uses the DMD as a spatial light modulation element.
Figure 16:
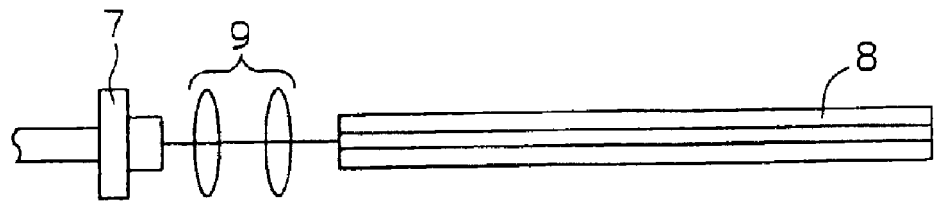
FIG. 16 is a cross-sectional view along an optical axis, illustrating the structure of a conventional fiber light source.

FIG. 14 shows a front view of the portion the collimator lenses 11 to 17 are mounted. Each of the collimator lenses 11 to 17 is formed in an elongated configuration which would be obtained by cutting, by planes parallel to each other, an area of circular lens having an aspheric surface and including an optical axis. The elongated collimator lens may be formed by molding, for example, a resin or an optical glass. The collimator lenses 11 to 17 are disposed, close to each other, in a direction that luminous points are arranged, so that the longitudinal directions thereof are orthogonal to a direction in which luminous points of the GaN-based semiconductor lasers LD1 to LD7 are arranged (i.e., right and left direction on the page surface of FIG. 14).

Lasers that have active layers with 2 $\mu$m of emission width and emit laser beams B1 to B7 for example with 10° of divergence angle in a direction parallel to the active layers and 30° of divergence angle in a direction orthogonal to the active layers are used as the GaN-based semiconductor lasers LD1 to LD7. Such GaN-based semiconductor lasers LD1 to LD7 are disposed so that their luminous points are arranged in a row in a direction parallel to the active layers.

Accordingly, the laser beams B1 to B7 respectively emitted from the luminous points are incident on the elongated collimator lenses 11 to 17 so that a direction in which the divergence angle is relatively large coincides with the longitudinal direction of the collimator lenses and a direction in which the divergence angle is relatively small coincides with the widthwise direction thereof (i.e., "the widthwise direction" represents a direction orthogonal to the longitudinal direction). Each of the collimator lenses 11 to 17 has a width of 1.1 mm and a length of 4.6 mm. The horizontal diameter of laser beams B1 to B7 incident on such collimator lenses 11 to 17 is 0.9 mm and the vertical diameter thereof is 2.6 mm. Each of the collimator lenses 11 to 17 has a focal distance f1=3 mm, NA=0.6 and a lens arrangement pitch= 1.25 mm.

The condenser lens 20 is obtained in an elongated configuration by cutting, by planes parallel to each other, an area of circular lens having an aspheric surface and including an optical axis. The condenser lens 20 is formed so as to be long in the direction in which the collimator lenses 11 to 17 are arranged, i.e., in a horizontal direction and short in a direction orthogonal to the horizontal direction. The condenser lens 20 has a focal distance f2=23 mm and NA=0.2. Also, the condenser lens 20 may be formed by molding, for example, a resin or an optical glass.

According to such laser module, laser beams B1, B2, B3, B4, B5, B6 and B7 emitted as divergent light from the GaN-based semiconductor lasers LD1 to LD7 constituting multiplexing laser light sources for the fiber array light source 66 are made into parallel lights by the corresponding collimator lenses 11 to 17. The parallel laser beams B1 to B7 are condensed by the condenser lens 20 and converged onto the incident end surface of a core 30a of the multi-mode optical fiber 30.

According to the present embodiment, a condensing optical system is formed by the collimator lenses 11 to 17 and the condenser lens 20, and a multiplexing optical system is formed by the condensing optical system and the multi-mode optical fiber 30. The laser beams B1 to B7 condensed as described above by the condenser lens 20 are incident on the core 30a of the multi-mode optical fiber 30, proceed within the optical fiber and are multiplexed into a laser beam B. Then, the laser beam B outputs from the optical fiber 31 coupled to the light-outputting end portion of the multi-mode optical fiber 30 outputs.

When the efficiency of coupling the laser beams B1 to B7 to the multi-mode optical fiber 30 is 0.85 and the GaN-based semiconductor lasers LD1 to LD7 have 30 mW of outputs in each of the laser modules, a multiplexing laser beam B with 180 mW (=30 mW×0.85×7) can be obtained for each of optical fibers 31 arranged in an array.

Examples that laser light emitted from a plurality of semiconductor chips is incident on an optical fiber have been described above. However, alternatively, laser light emitted from a single broad stripe laser device with stripe-shaped emission area may be incident on an optical fiber.

A modified example of using a broad stripe laser will be described hereinafter.

Figure 19:
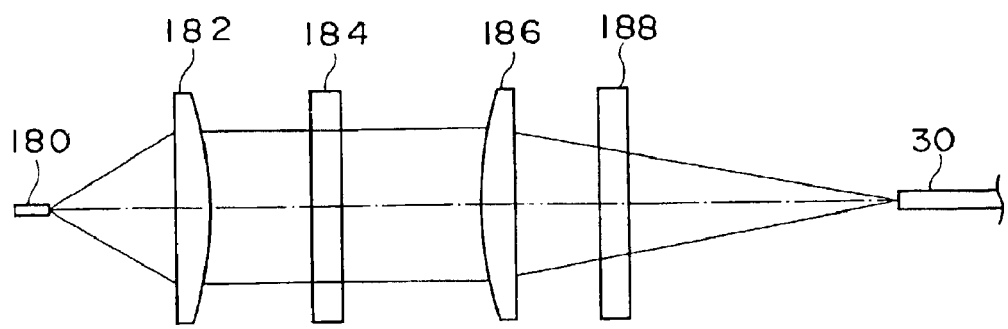
FIG. 19 is a side view showing a light source in which broad stripe laser is used.
Figure 20:
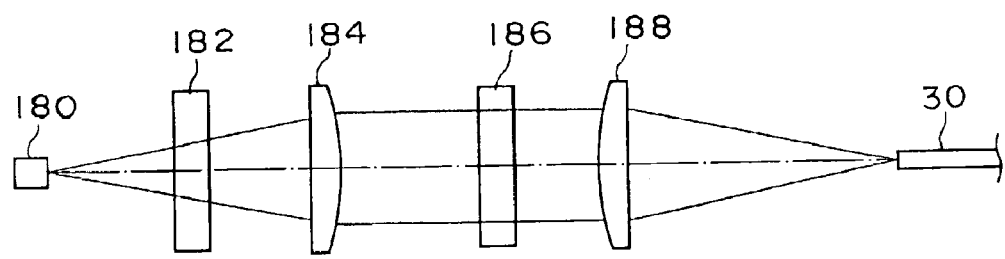
FIG. 20 is a plan view of the light source of FIG. 19.

As shown in FIGS. 19 and 20, in accordance with the present embodiment, a broad stripe laser 180 is used as an illumination light source. FIG. 19 is a side view of a device seen from a side. FIG. 20 is a plan view of the device seen from above.

A first cylindrical lens 182, a second cylindrical lens 184, a third cylindrical lens 186 and a fourth cylindrical lens 188 are disposed in this order from the side of the broad stripe laser 180, between the broad stripe laser 180 and one end of a multi-mode optical fiber 30.

As shown in FIGS. 19 and 20, the broad stripe laser 180 has an emission area (not shown) which is long in a horizontal direction.

In accordance with the broad stripe laser 180 of the present embodiment, a width (in the vertical direction) of the emission layer thereof is 0.5 $\mu$m, a length (in the horizontal direction) of the emission layer is 30 $\mu$m and a wavelength for light beam is 400 to 420 nm.

It should be noted that NA of the beam in the vertical direction is converted so as to be less than NA of the multi-mode optical fiber 30 by the first cylindrical lens 182 and the third cylindrical lens 186.

Further, light beam is imaged onto one end of the multi-mode optical fiber 30 at a magnification of one (i.e., ×1) in the horizontal direction by the second cylindrical lens 184 and the fourth cylindrical lens 188. (Namely, the horizontal-direction length of the emission layer, which is 30 μm, is imaged onto the fiber core portion.)

In accordance with the present embodiment, beams from the broad stripe laser 180 with an output of the emission point thereof being 200 mW are converged so as to be incident upon one multi-mode optical fiber 30.

If the "light-yield" efficiency is 90%, 180 mW of the light source can be obtained.

Although the example of coupling a fiber having a clad diameter of 60 μm has been described above, by making beams from the broad stripe laser 180 be directly incident on the multi-mode optical fiber 30 having a clad diameter of 60 μm and a core diameter of 50 μm, the beams having the original diameter may be used, as it is, as an output end.

It is preferable that a width of the broad stripe of the broad stripe laser 180 is 5 to 20 μm, NA of the multi-mode optical fiber 30 is 0.15 to 0.3 and the diameter of the fiber core is 10 to 80 μm because coupling efficiency of the fiber is then improved.

Although the beam shaping optical system is structured by using the cylindrical lenses, the beam shaping optical system may be structured by using optical components other than the cylindrical lenses.

[Light Source with Plurality of Luminous Points]

There has been described an example in which a fiber bundle light source, in which optical fibers from a plurality of fiber light sources are bundled, are used as an illumination light source. However, a laser array in which a plurality of semiconductor laser chips are arranged on a heat block in a predetermined direction with predetermined intervals therebetween or a multi-cavity laser chip in which a plurality of luminous points are arranged in a predetermined direction at predetermined intervals therebetween may be used as the illumination light source. In the case of the multi-cavity laser, luminous points can be arranged with excellent positional precision as compared to the case of arranging semiconductor laser chips.

Figure 17A:
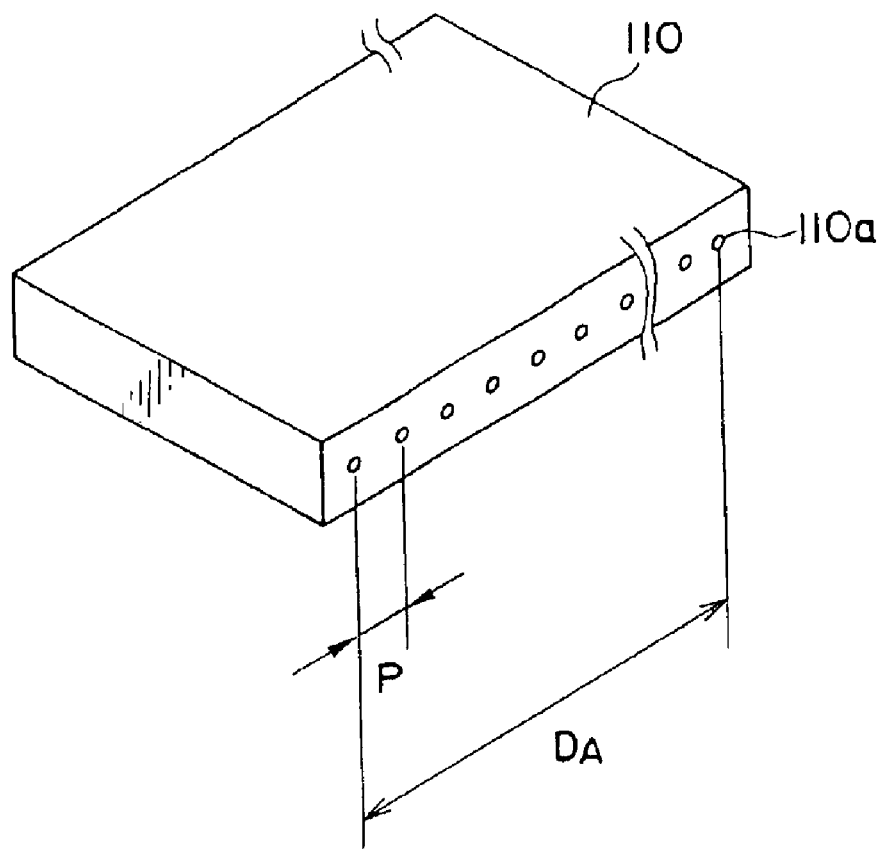
FIGS. 17A and 17B are explanatory views for explaining parameters in the case of using a multi-cavity laser as the illumination light source.
Figure 17B:
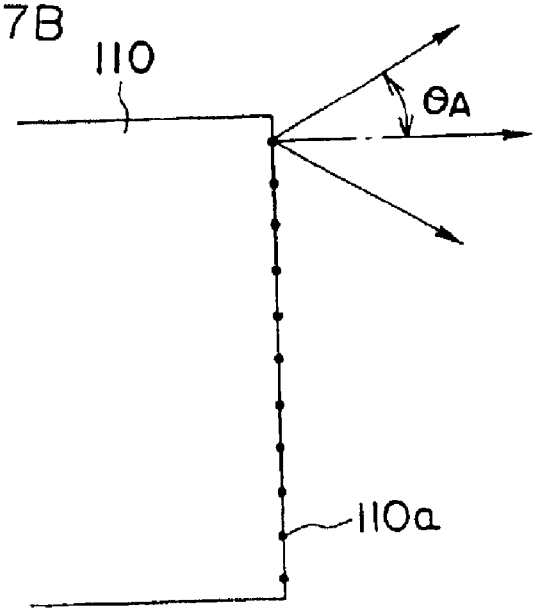

An example for using the multi-cavity laser as the illumination light source will be described with reference to FIGS. 17A and 17B. As shown in FIG. 17A, in the multi-cavity laser 110, a large number of luminous points 110a are arranged along a predetermined direction with predetermined intervals therebetween. A total width of beams outputted from all luminous points for the illumination light source under such state is indicated by $D_A$ (mm). As shown in FIG. 17B, an angle of beam outputted from a luminous point is indicated by $\theta_A$ (rad). In the above relational formula (A), when $\theta_A$ is inputted instead of the angle $\theta$ of beam outputted from optical fiber and the total output beam width $D_A$ is inputted instead of the width D of beam outputted from laser device, the following relational formula (B) is derived.

$$\frac{D_A}{W} \leq \frac{\frac{\alpha \times M}{2 \times t} - \frac{K \times \lambda}{a}}{\theta_A}$$

λ: the wavelength of laser light
$\theta_A$: the angle of beam outputted from a luminous point
$D_A$: the total width of beams outputted from all luminous points W: the beam width at the position of DMD (at the irradiated surface)
a: the size of one pixel on DMD
K: a coefficient determined by beam characteristics, K=1
M: the magnification of imaging optical system
t: a required focal depth
α: an acceptable increased amount of beam diameter When the interval between luminous points is indicated by P (mm) and the number of luminous points is indicated by m, the total width $D_A$ of beams outputted from all luminous points of the illumination light source is expressed by the following formula. For example, the fixed interval between luminous points may be 0.1 (mm) and the number of luminous points may be 24.

$$P(m-1)$$

Figure 18:
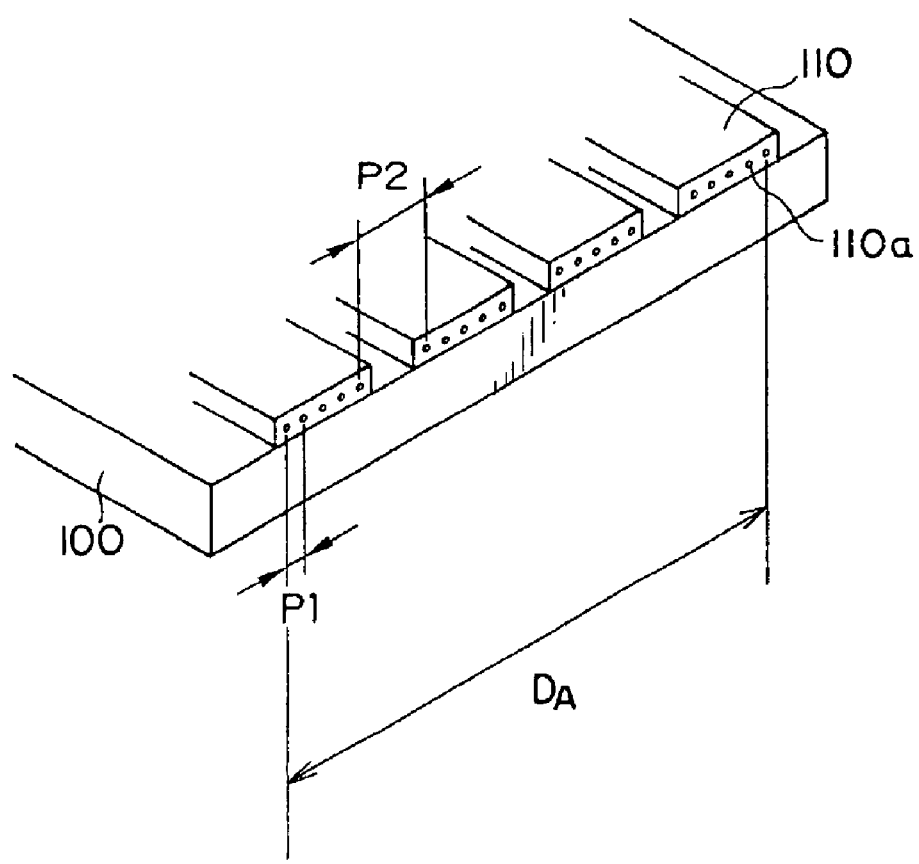
FIG. 18 is an explanatory view for explaining parameters in the case of using a multi-cavity laser array as the illumination light source.

As shown in FIG. 18, a multi-cavity laser array in which multi-cavity lasers 110 are arranged on a heat block 100 in the same direction as the direction of arranging luminous points 110a for each of chips, with predetermined intervals therebetween, may be used for the illuminating device. It is assumed that the interval between a large number of luminous points is indicated by P1 (mm), the interval between luminous points for adjacent multi-cavity lasers is indicated by P2 (mm), the number of luminous points is indicated by m and the number of multi-cavity lasers is indicated by N. Then, the total width $D_A$ of beams outputted from all luminous points for the illumination light source is expressed by the following formula.

$$(m-1)N*P1+(N-1)*P2$$

The DMD 50 has been used as a spatial modulation element in the aforementioned embodiments. However, instead of the DMD 50, reflection type or transmission type liquid crystal panels with a plurality of pixels arranged in a matrix may be used. When a transmission type liquid crystal panel is used, an optical system may be structured so that laser light which has been transmitted through the lens system 67 is further transmitted through the liquid crystal panel.

As described above, according to the effect of the invention, deep focal depth can be obtained without providing an autofocus mechanism.

What is claimed is:

1. An exposure head which is moved relative to an exposed surface in a direction orthogonal to a predetermined direction, comprising:

a laser device which has a plurality of fiber light sources for emitting laser light incident from optical-fiber incident ends thereof, from output ends thereof, and in which luminous points at the optical-fiber output ends of the plurality of fiber light sources are arranged;

a modulation means which is capable of changing a modulation state of laser light, in accordance with a control signal, for each of pixels thereon which have been arranged in a two dimensional manner; and an optical system for imaging laser light outputted from the laser device and modulated at pixel portions of the modulation means onto the exposed surface, wherein parameters defined as follows satisfy the following formula, $$\frac{D_A}{W} \le \frac{\frac{\alpha \times M}{2 \times t} - \frac{K \times \lambda}{a}}{\theta}$$

λ: the wavelength of laser light
θ: the angle of beam outputted from optical fiber that is derived by a numerical aperture (NA) of optical fiber according to the following formula θ=sin$^{-1}$(NA)

D: the width of beam outputted from the laser device
W: the beam width at the position of the modulation means (at the irradiated surface)
a: the size of one pixel on the modulation means
K: a coefficient determined by beam characteristics, K=1
M: the magnification of imaging optical system
t: required focal depth
α: acceptable increased amount of beam diameter.

2. An exposure head according to claim 1, wherein the modulation means is a micromirror device in which a large number of micromirrors are two-dimensionally arranged on a substrate such that angles of reflection surfaces of the micromirrors can be varied according to control signals, and parameters defined below satisfy the following formulae, respectively $$\frac{D_A}{W} \le \frac{\frac{\alpha \times M}{2 \times t} - \frac{K \times \lambda}{a}}{\theta}$$

λ: the wavelength of laser light
θ: the angle of beam outputted from optical fiber that is derived by a numerical aperture (NA) of optical fiber according to the following formula θ=sin$^{-1}$(NA)

D: the width of beam outputted from the laser device
W: the beam width at the position of a digital micromirror device (DMD)(at the irradiated surface)
a: the size of one pixel on the DMD
K: a coefficient determined by beam characteristics, K=1
M: the magnification of imaging optical system
t: required focal depth
α: acceptable increased amount of beam diameter.

3. An exposure head according to claim 1, wherein, when an error in an focal depth direction is indicated by Δz, the following formula is satisfied, Δz=α·M/2{(θ×D)/W+(K×λ)/a} and t≦Δz.

4. An exposure head according to claim 1, wherein the plurality of luminous points are linearly arranged and the angle φ (rad) formed by light outputted from the central luminous point, of said luminous points, and light outputted from the luminous point placed at the end portion is represented by the following formula, $$\phi = \frac{\theta \times D}{W}$$

given that the light reflected by the modulation means is diverged by the divergence angle Ψ (rad) because of diffraction effect caused by the influence of the size of pixels on the modulation means, the diffraction divergence angle Ψ is represented by the following formula, and $$\psi = \frac{K \times \lambda}{a}$$

(φ+Ψ) in the predetermined direction is substantially equal to (φ+Ψ) in a direction orthogonal to the predetermined direction.

5. An exposure head according to claim 4, wherein the ratio of the longer side direction size of the drive area for the modulation means to the shorter side direction size of the drive area for the modulation means, the ratio of the beam width in the longer side direction at the position the modulation means is placed to the beam width in the shorter side direction at said position and the ratio of the longer side direction width of beam outputted from the laser device to the shorter side direction width of beam outputted from the laser device are substantially equal.

6. An exposure head according to claim 4, wherein the fiber light source is formed of a high intensity fiber light source.

7. An exposure head according to claim 1, wherein an optical fiber in which a core diameter thereof is uniform and a clad diameter thereof at the output end is smaller than a clad diameter at the incident end is used as the optical fiber.

8. An exposure head according to claim 1, wherein the fiber light source multiplexes a plurality of laser lights to make the resultant multiplexed light incident onto each of the optical fibers.

9. An exposure head which is moved relative to an exposed surface in a direction orthogonal to a predetermined direction, comprising:
a laser device in which a plurality of luminous points are arranged in a predetermined direction with predetermined intervals therebetween;
a modulation means which is capable of changing a modulation state of laser light, in accordance with a control signal, for each of pixels thereon which have been arranged in a two dimensional manner; and
an optical system for imaging laser light outputted from the laser device and modulated at pixel portions on the modulation means onto the exposed surface,
wherein parameters defined as follows satisfy the following formulae, respectively $$\frac{D_A}{W} \le \frac{\frac{\alpha \times M}{2 \times t} - \frac{K \times \lambda}{a}}{\theta_A}$$

λ: the wavelength of laser light
$\theta_A$: the angle of beam outputted from luminous points
$D_A$: the total width of beams outputted from all luminous points
W: the beam width at the position of the modulation means (at the irradiated surface)

a: the size of one pixel on the modulation means

K: a coefficient determined by beam characteristics, K=1

M: the magnification of imaging optical system t: required focal depth

α: acceptable increased amount of beam diameter.

10. An exposure head according to claim 9, wherein the modulation means is a micromirror device in which a large number of micromirrors are two-dimensionally arranged on a substrate such that angles of reflection surfaces of the micromirrors can be varied according to control signals, the exposure head further comprises an optical system for imaging laser light outputted from the laser device and modulated at pixel portions on the micromirror device onto the exposed surface, and parameters defined below satisfy the following formulae, respectively $$\frac{D_A}{W} \le \frac{\frac{\alpha \times M}{2 \times t} - \frac{K \times \lambda}{a}}{\theta_A}$$

λ: the wavelength of laser light $\theta_A$: the angle of beam outputted from luminous points $D_A$: the total width of beams outputted from all luminous points W: the beam width at the position of a digital micromirror device (DMD) (at the irradiated surface)

a: the size of one pixel on the DMD

K: a coefficient determined by beam characteristics, K=1

M: the magnification of imaging optical system t: required focal depth

α: acceptable increased amount of beam diameter.

11. An exposure head according to claim 9 wherein when the predetermined interval between the plurality of luminous points is indicated by P and the number of luminous points is indicated by m, the total width $D_A$ of beams outputted from all luminous points at the laser device is represented by the following formula, P(m−1).

12. An exposure head according to claim 9, wherein a plurality of multi-cavity laser arrays arranged in the same direction as a direction of arranging luminous points via cavities serve as the laser device and when the interval between arranged luminous points is indicated by P1, the interval between arranged cavities is indicated by P2, the number of the luminous points is indicated by m, and the number of the multi-cavity lasers is indicated by N, the total width $D_A$ of beams outputted from all luminous points at the laser device is represented by the following formula, (m−1)N*P1+(N−1)*P2.

13. An exposure head according to claim 9, wherein, when an error in a focal depth direction is indicated by Δz, the following formula is satisfied, $$\Delta z = \alpha \cdot M/2\{(\theta_A \times D_A)/W + (K \times \lambda)/a\}$$

and t ≤ Δz.

14. An exposure head according to claim 9, wherein the plurality of luminous points are linearly arranged, and the angle φ (rad) formed by light outputted from the central luminous point, of said luminous points, and light outputted from the luminous point placed at the end is represented by the following formula, $$\phi = \theta_A \times D/W$$

given that the light reflected by the modulation means is diverged by the divergence angle Ψ (rad) because of diffraction effect caused by the influence of the size of pixels on the modulation means, the diffraction divergence angle Ψ is represented by the following formula, $$\Psi = K \times \lambda / a$$

and (φ+Ψ) in the predetermined direction is substantially equal to (φ+Ψ) in a direction orthogonal to the predetermined direction.

15. An exposure head according to claim 14, wherein the ratio of the longer side direction size of the drive area for the modulation means to the shorter side direction size of the drive area for the modulation means, the ratio of the beam width in the longer side direction at the position the modulation means is placed to the beam width in the shorter side direction at said position and the ratio of the longer side direction width of beam outputted from the laser device to the shorter side direction width of beam outputted from the laser device are substantially equal.

16. An exposure head according to claim 14, wherein the fiber light source is formed of a high intensity fiber light source.

17. An exposure head according to claim 9, wherein an optical fiber in which a core diameter thereof is uniform and a clad diameter thereof at the output end is smaller than a clad diameter at the incident end is used as the optical fiber.

* * * * *